( 12 ) United States Patent
Mahmoodian et al.

(10) Patent No.: US 10,261,250 B2
(45) Date of Patent: Apr. 16, 2019

(54) EFFICIENT SPIN-PHOTON INTERFACE USING GLIDE-PLANE-SYMMETRIC WAVEGUIDE

(71) Applicant: UNIVERSITY OF COPENHAGEN, Copenhagen K (DK)

(72) Inventors: Sahand Mahmoodian, Copenhagen (DK); Immo Nathanael Söllner, København Ø (DK); Søren Stobbe, København V (DK); Peter Lodahl, Birkerød (DK)

(73) Assignee: UNIVERSITY OF COPENHAGEN, Copenhagen K (DK)

( * ) Notice: Subject to any disclaimer, the term of this patent is extended or adjusted under 35 U.S.C. 154(b) by 11 days.

(21) Appl. No.: 15/319,182

(22) PCT Filed: Jun. 15, 2015

(86) PCT No.: PCT/EP2015/063340
§ 371 (c)(1),
(2) Date: Dec. 15, 2016

(87) PCT Pub. No.: WO2015/193240
PCT Pub. Date: Dec. 23, 2015

(65) Prior Publication Data
US 2018/0210149 A1 Jul. 26, 2018

(30) Foreign Application Priority Data
Jun. 16, 2014 (EP) .................................. 14172566

(51) Int. Cl.
*G02B 6/122* (2006.01)
*B82Y 20/00* (2011.01)
(Continued)

(52) U.S. Cl.
CPC ............ *G02B 6/1225* (2013.01); *B82Y 20/00* (2013.01); *G02B 1/005* (2013.01); *G02B 6/1223* (2013.01);
(Continued)

(58) Field of Classification Search
CPC ... G02B 1/005; G02B 6/1225; G02F 2202/32; B82Y 20/00
See application file for complete search history.

(56) References Cited

U.S. PATENT DOCUMENTS 6,542,682 B2 * 4/2003 Cotteverte ............. B82Y 20/00
385/125
7,349,613 B2 * 3/2008 Wang ..................... B82Y 20/00
385/129

(Continued)

OTHER PUBLICATIONS

Konishi, Kuniaki et al., "Circularly Polarized Light Emission from Semiconductor Planar Chiral Nanostructures", Phys. Rev. Lett., vol. 106, Issue 5, pp. 057402-1 to 057402-4, (Feb. 2011).*

(Continued)

*Primary Examiner* — Daniel Petkovsek
(74) *Attorney, Agent, or Firm* — Duane Morris LLP; Gregory M. Lefkowitz; Jason M. Nolan

(57) ABSTRACT

An optical device comprising a planar waveguide and a quantum emitter is presented. The planar waveguide comprises a longitudinal extending guiding region with a first side and a second side. A first nanostructure is arranged on the first side of the guiding region, and a second nanostructure is arranged on the second side of the guiding region. The planar waveguide includes a first longitudinal region where the first nanostructure and the second nanostructure are arranged substantially glide-plane symmetric about the guiding region of the planar waveguide, and the quantum emitter is coupled to the first longitudinal region of the planar waveguide.

20 Claims, 6 Drawing Sheets

(51) Int. Cl.
*G02B 1/00* (2006.01)
*G02B 6/12* (2006.01)

(52) U.S. Cl.
CPC .............. *G02B 2006/12078* (2013.01); *G02F 2202/32* (2013.01)

(56) References Cited

U.S. PATENT DOCUMENTS

| | | | |
|---|---|---|---|
| 7,630,604 B2 * | 12/2009 | Waks | G02F 1/365 372/97 |
| 9,798,083 B2 * | 10/2017 | Mahmoodian | G02B 6/1225 |
| 2005/0158898 A1 | 7/2005 | Scherer | |
| 2012/0044489 A1 | 2/2012 | Chakravarty et al. | |
| 2018/0217331 A1 * | 8/2018 | Stobbe | G02B 6/1225 |

OTHER PUBLICATIONS

Adam Mock et al: "Space group theory and Fourier space analysis of two-dimensional photonic crystal waveguides", Physical Review B, vol. 81, No. 15, Apr. 19, 2010 (Apr. 19, 2010), XP055158665, ISSN: 1098-0121, DOI: 10.1103/PhysRevB.81.155115.

Peter Lodahl et al: "Interfacing single photons and single quantum dots with photonic nanostructures", Dec. 4, 2013 (Dec. 4, 2013), XP055158721, Retrieved from the Internet <URL:http://arxiv.org/abs/1312.1679> [retrieved on Dec. 15, 2014].

* cited by examiner

EFFICIENT SPIN-PHOTON INTERFACE USING GLIDE-PLANE-SYMMETRIC WAVEGUIDE

CROSS-REFERENCE TO RELATED APPLICATIONS

This application is a § 371 national stage entry of International Application No. PCT/EP2015/063340, filed Jun. 15, 2015, which claims priority to European Patent Application No. 14172566.3 filed Jun. 16, 2014, the entire contents of which are incorporated herein by reference.

FIELD OF THE INVENTION

The present invention relates to an optical device comprising a planar waveguide and a quantum emitter.

BACKGROUND OF THE INVENTION

Data on everyday computers are comprised of bits, which are a binary sequence of zeroes and ones. These bits can be stored magnetically on hard drives or electrically on flash drives. In the last few decades quantum information processing using quantum bits or "qubits" has emerged as a completely new form of computation. Unlike a bit, a single qubit is a quantum mechanical object and can be in a combination or superposition of zero and one states. Qubits can be manipulated and processed to perform computational tasks.

Two common ways to represent a qubit include: using the quantized angular momentum, or spin, of a charged particle, e.g. spin up=0 and spin down=1, or by using photons, e.g. no photon present=0, one photon present=1.

It has been suggested that semiconductor quantum dots (QDs) are excellent candidates for stationary qubits. The large oscillator strengths of their optical transitions allow for quick initialization, optical manipulation, and read-out of the spin state. In addition, the solid-state nature of these emitters makes it possible to structure their environment on the nanometre length scale, thus allowing engineering of their photonic local density of optical states (LDOS) through fabrication of photonic-crystal structures. For guiding light along certain directions, such photonic crystals typically utilise a geometry where a nanostructure is arranged mirror symmetric (or up-down symmetric) about a guiding region. However, due to the symmetry of such photonic-crystal waveguides, these waveguides have electric fields that are even or odd functions with respect to the guiding region and are dominated by electric fields that are linearly polarized. Therefore, the different spin states of quantum dots or any integrated quantum emitter with circularly polarized transition dipole moments cannot efficiently couple to such waveguides.

Adam Mock et al.: "Space group theory and Fourier space analysis of two-dimensional photonic crystal waveguides", Physical Review B, Vol. 81, no. 14 discloses type B waveguides, where the photonic-crystal lattice on each side of a guiding region is shifted in the longitudinal direction by half a period, thereby possessing glide-plane symmetry. The type B waveguides are utilized to reduce out-of-plane radiation losses of linear polarized light propagating through the waveguide.

Peter Lodahl et al.: "Interfacing single photons and single quantum dots with photonic nanostructures", 4 Dec. 2013, ArXiv, is a disclosure by the present inventor group that provides an overview of quantum optics with excitons in single quantum dots embedded in photonic nanostructures.

Overall, there is still a need for waveguides that allow for on-chip efficiently read-out of quantum emitters having circularly polarized transition dipole moments.

SUMMARY OF THE INVENTION

It is an object of the invention to obtain an optical device, which overcomes or ameliorates at least one of the disadvantages of the prior art or which provides a useful alternative.

According to the invention, this is obtained by an optical device comprising a planar waveguide and a quantum emitter, wherein the planar waveguide comprises:
   a longitudinal extending guiding region with a first side and a second side,
   a first nanostructure arranged on the first side of the guiding region, and
   a second nanostructure arranged on the second side of the guiding region, wherein
   the planar waveguide includes a first longitudinal region where the first nanostructure and the second structure are arranged substantially glide-plane symmetric about the guiding region of the waveguide,
   and wherein the quantum emitter is coupled to the first region of the planar waveguide.

The planar waveguide with glide-plane-symmetric nanostructures about a guiding region provides a waveguide, whose modes have electric fields with a strong in-plane circular polarisation. The modes of the structure can couple to the different spin states of quantum dots or any integrated quantum emitter, whose transition dipole moment is circularly polarised. Accordingly, the invention provides a photonic nanostructure that enables photon qubits to interact very efficiently with spin qubits, and thereby a device where a quantum emitter with a high efficiency can couple to the planar waveguide and be read out. It should be noted that "the circular polarized modes" are not circularly polarized in the conventional sense. In terms of the present invention and planar waveguides, the electric field vector is circularly polarized within the plane of the structure at the position of the emitter.

The quantum emitter may include optical transitions that are circularly polarised. Accordingly, it is seen that the quantum emitter functions as a single-photon emitter, which emits photons in a circularly polarised mode. Such transitions have been found to couple very effectively to planar waveguides with a substantially glide-plane-symmetric nanostructure.

The quantum emitter may be arranged on or embedded in the guiding region of the planar waveguide. The quantum emitter may for instance be epitaxially grown, e.g. via molecular beam epitaxy, or deposition.

It should be noted that the term longitudinal does not mean that the guiding region is necessarily arranged along a straight line. It means that the light in general propagates in a given direction of the waveguide.

It is also noted that the term nanostructure should also not be perceived in a too limiting manner. It merely indicates that the nanostructure has relative small dimensions e.g. in the size from tens of nanometres to thousands of nanometres. Further, the term "optical" should also not be perceived in a too limiting manner, and it is recognised that the optical range comprises both infrared light, visible light and ultraviolet light. Further, it is also conceived that the invention is applicable for microwaves, x-rays and the like. Accordingly, the term may also encompass such frequencies and wavelengths. The nanostructures should of course be designed according to the given frequency and wavelength range.

In general, the first nanostructure and the second nanostructure need to be arranged with some sort of periodicity and the periodicity of the first nanostructure and the second nanostructure are mutually shifted or translated in the longitudinal direction of the planar waveguide and thus that the mirror symmetry is broken. By "substantially glide-plane symmetric" is meant that the two nanostructures are mutually shifted by 25%-75% of the period of the structure in the longitudinal direction of the planar waveguide, preferably around half a period. It is noted that even a 25% shift (or equivalently a 75% shift) will provide a large improvement of the coupling efficiency of the spin coupling. However, in order to maximise the coupling efficiency, the shift should be approximately half a period. Accordingly, the mutual shift may advantageously be 30-70%, and more advantageously 40-60%, and even more advantageously 45-55% of the nanostructure period, e.g. shifted about half a period.

Accordingly, it is also seen that the invention provides an optical device comprising a planar waveguide and a quantum emitter, wherein the planar waveguide comprises:
- a longitudinal extending guiding region with a first side and a second side,
- a first nanostructure arranged with a periodicity on the first side of the guiding region, and
- a second nanostructure arranged with said periodicity on the second side of the guiding region, wherein
- the planar waveguide includes a first longitudinal region where the first nanostructure and the second structure are mutually shifted by 25%-75% of a period in a longitudinal direction of the planar waveguide,
- and wherein the quantum emitter is coupled to the first region of the planar waveguide.

The nanostructures are advantageously arranged in a lattice structure, i.e. the first nanostructure arranged in a first lattice structure, and the second nanostructure arranged in a second lattice structure. Since the nanostructures are arranged substantially with glide-plane symmetry, this means that the first lattice structure and the second lattice structure are mutually shifted with substantially half a period or lattice constant in the longitudinal direction of the waveguide.

According to a preferred embodiment, the quantum emitter is a quantum dot or another type of single-photon source. However, the planar waveguide with glide-plane symmetry could also be applied in other systems, e.g. with atoms, ions, or molecules.

The quantum dot advantageously has a height of 1-10 nm, and an in-plane size in the range of 10-70 nm. The quantum dot may consist of $10^4$ to $10^6$ number of atoms.

The planar waveguide is advantageously a photonic crystal waveguide.

According to yet another advantageous embodiment, the planar waveguide comprises a second longitudinal region, where the first nanostructure and the second nanostructure are arranged mirror-symmetric about the guiding region of the waveguide. Thereby, the light propagating through the planar waveguide may couple efficiently to a conventional waveguide.

According to a particular advantageous embodiment, the planar waveguide comprises a transition region, advantageously arranged between the first longitudinal region and the second longitudinal region, and wherein the geometry of the first and the second nanostructure gradually changes from glide-plane symmetry to mirror symmetry. Thereby, the guided mode is gradually changed from a circular polarisation to a linear polarisation with low or no loss and may more efficiently be coupled to a conventional waveguide.

A longitudinal extent of the transition region may advantageously be in the range of 3-30 lattice constants a (or nanostructure periods), or in the range of 4-20 lattice constants a, or in the range of 5-15 lattice constants a.

According to one embodiment, a lattice constant of the first nanostructure and/or a lattice constant of the second nanostructure of the intermediate transition region are different from that of the first region. In practice, the transition may be designed in a number of ways. The nanostructures of the first region and the second region may for instance have the same lattice constant a. The first nanostructure of the transition region may have a lattice constant $a+\Delta a$ (or $a-\Delta a$), whereas the second nanostructure of the transition region may have the same lattice constant as the first region and the second region (or vice versa). Alternatively, the first nanostructure of the transition region may have a lattice constant $a+0.5\Delta a$, whereas the second nanostructure of the transition region may have a lattice constant $a-0.5\Delta a$.

According to another embodiment, the lattice constant of the first region is identical to the lattice constant of the second region. However, in principle, it is also possible that the lattice constants of the two regions are different, e.g. in order to accommodate for the different mode profiles.

According to yet another embodiment, a conventional waveguide, such as a ridge waveguide or a strip waveguide, is coupled to the second longitudinal region or the transition region.

According to an advantageous embodiment, the planar waveguide comprises a corresponding design on an opposite side of the first longitudinal region. Accordingly, the planar waveguide may comprise an additional second longitudinal region on an opposite longitudinal side of the first longitudinal region, where the first nanostructure and the second nanostructure are arranged mirror symmetric about the guiding region of the waveguide, and preferably with an additional transition region arranged between the first longitudinal region and the additional second longitudinal region, and wherein the geometry of the first and the second nanostructure gradually changes from a glide-plane symmetry to a mirror symmetry. Thus, it is seen that an embodiment is provided with the quantum emitter is coupled into the first longitudinal region and then propagates in the guiding region towards either the second longitudinal region or the additional second longitudinal region. The emitted photon will with high probability couple to a specific propagation direction dependent on the spin state of the photon.

According to another advantageous embodiment, the planar waveguide is made from a dielectric material, such as an III-V semiconductor material. The material may for instance be made of Gallium Arsenide (GaAs), Indium Gallium Arsenide (InGaAs), or Aluminium Arsenide (AlAs). This provides a waveguide which is particular adapted to for instance quantum dots. The quantum dot is preferably also made of an III-V semiconductor material.

Advantageously, the first nanostructure and/or the second nanostructure comprise air holes. However, in principle the nanostructure may also be made of a different material than the remainder of the planar waveguide material and having a refractive index being different from that of the remainder.

In one embodiment, the planar waveguide is made of a material having a refractive index in the region of 2-5, or 2.5-4.5, e.g. around 3.5, i.e. the material is made of e.g. a high refractive index dielectric. In another embodiment, a difference in refractive index of the planar waveguide material and the first and second nanostructures is in the region of 1-4, or 1.5-3.5, e.g. around 2.5.

In yet another embodiment, the planar waveguide is adapted to guide light within a wavelength interval in the region of 620-1200 nm, and wherein the quantum emitter emits photons having a wavelength within said interval.

According to an advantageous embodiment, the first nanostructure and the second nanostructure are arranged in a first lattice structure and a second lattice structure, respectively, advantageously arranged in a triangular lattice and having a lattice constant a. In general the design of the nanostructure, e.g. the lattice structure of the photonic crystal waveguide, should be matched to the desired guided modes. The in-waveguide wavelength may for instance be twice the length of the lattice constant.

According to another advantageous embodiment, the lattice constant a lies in the interval 100-500 nm, or 150-400 nm, or 200-300 nm, e.g. around 250 nm.

In one embodiment, the nanostructures are substantially circularly shaped and have a diameter of between 0.2a and 0.4a, e.g. around 0.3a.

The guiding region may for instance be in the region 100-1000 nm. The guiding region is often formed by removing a line of holes. Accordingly, the transverse distance between centres of proximal nanostructures (e.g. holes) on the first side and the second side is √3 times the lattice constant a.

The planar waveguide may advantageously have a thickness of between 0.2a and 1a, or between 0.4a and 0.8a, or between 0.3a and 0.7a, e.g. around 0.5a or 0.6a. Alternatively, the planar waveguide may have a thickness in the range of 50-500 nm, or 75-350 nm, or 100-250 nm, e.g. around 150 nm. Accordingly, it is seen that the planar waveguide is a slab waveguide or also what in the technical area is called a membrane.

The planar waveguide is advantageously designed as a floating structure along at least a substantial part of the planar waveguide. Such a design minimises the losses by minimising light being coupled out of the plane.

The optical device may for instance be a single-photon transistor or a controlled NOT (cNot) gate, which are essential building blocks of quantum computers, optical computers, and quantum information technology, or equivalently, the invention provides:

a single-photon transistor comprising an optical device according to any of the aforementioned embodiments, or a controlled NOT gate comprising an optical device according to any of the aforementioned embodiment.

The object of the invention is also achieved by a planar waveguide (or an optical device comprising a planar waveguide), where the planar waveguide comprises:

a longitudinal extending guiding region with a first side and a second side, a first nanostructure arranged on the first side of the guiding region, and a second nanostructure arranged on the second side of the guiding region, wherein the waveguide comprises:

a first longitudinal region, where the first nanostructure and the second nanostructure are arranged substantially glide-plane symmetric about the guiding region of the waveguide, and a transition region wherein the geometry of the first and the second nanostructure gradually changes from glide-plane symmetry to mirror symmetry.

This provides a planar waveguide, which is particularly suited for efficiently in-coupling photons emitted from a quantum emitter and out-coupling the photons to other optical devices.

The first nanostructure and the second nanostructure are advantageously arranged in a lattice arrangement, preferably a triangular lattice arrangement. The planar waveguide is advantageously a photonic crystal waveguide. In general, the planar waveguide may have a design according to any of the afore-mentioned embodiments. Thus, the definitions relating to the terms "longitudinal" and "substantially glide-plane symmetric" also apply to said planar waveguide.

BRIEF DESCRIPTION OF THE FIGURES

The invention is explained in detail below with reference to embodiments shown in the drawings, in which.

DETAILED DESCRIPTION OF THE INVENTION

Figure 1:
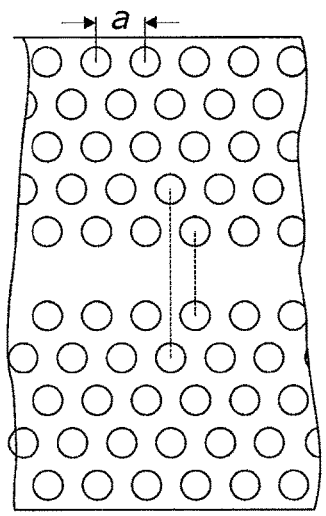
FIG. 1 shows a conventional photonic crystal waveguide with mirror-symmetric nanostructure.

FIG. 1 shows a conventional waveguide having a mirror-symmetric nanostructure about a guiding region, also called up-down symmetry. The circles in the figure represent a nanostructure of air holes in a high index dielectric material, such as GaAs. The lattice possesses a photonic band gap that enables light to be guided in the guiding region, which is the central region shown in the figure, where there are no circles.

Figure 3:
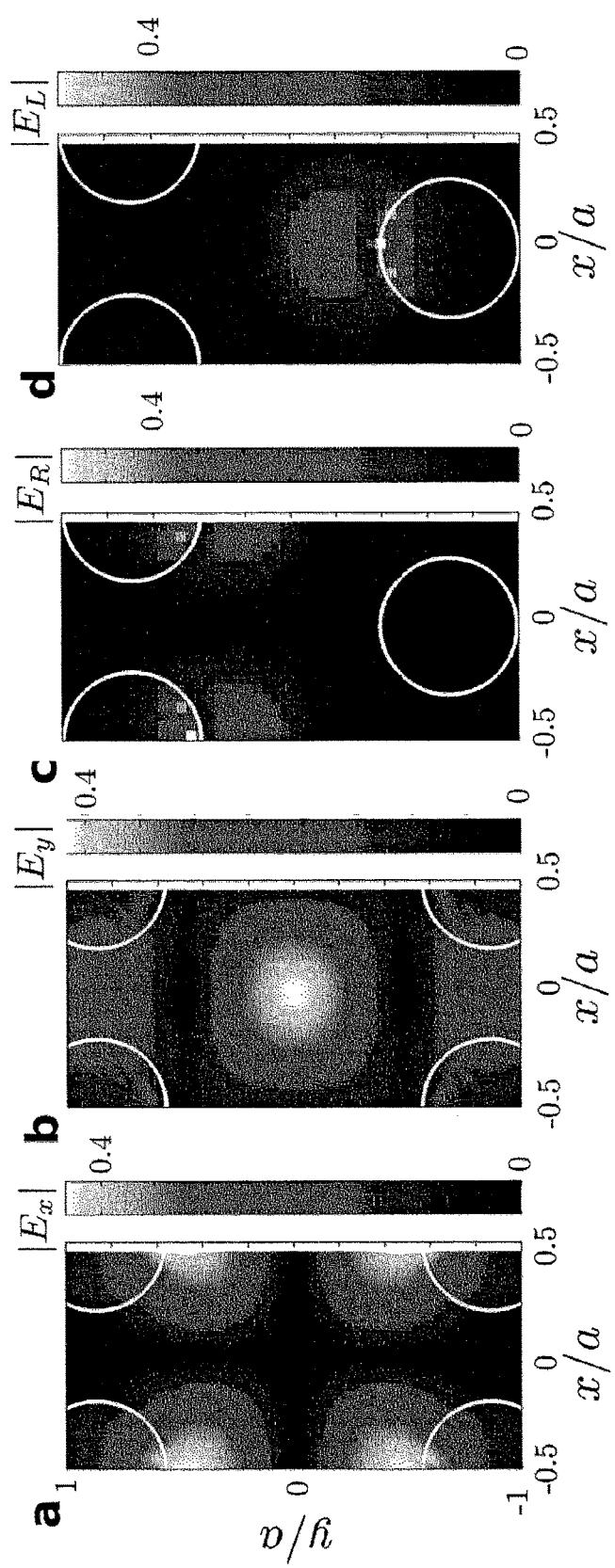
FIGS. 3a and 3b show electric-field amplitudes in a conventional photonic-crystal waveguide as shown in FIG. 1.
FIGS. 3c and 3d shows electric-field amplitudes in a planar waveguide according to the invention.

FIGS. 3a and 3b show the electric field for a typical mode in a symmetric photonic-crystal membrane waveguide with refractive index n=3.46, radius r=0.3a, and waveguide thickness t=0.6a, where a is the lattice period. FIG. 3a shows the x-component of the electric field and FIG. 3b shows the y-component. Due to the mirror symmetry, these waveguides have electric fields that are even or odd functions with respect to the waveguide centre (y=0), and such a waveguide mode is dominated by an electric field that is linearly polarized.

The types of fields needed to efficiently couple to circular dipoles are impossible to obtain at the field maxima of a propagating mode with the above symmetry restrictions. Accordingly, there is still a need for efficient on-chip spin readout.

Figure 2:
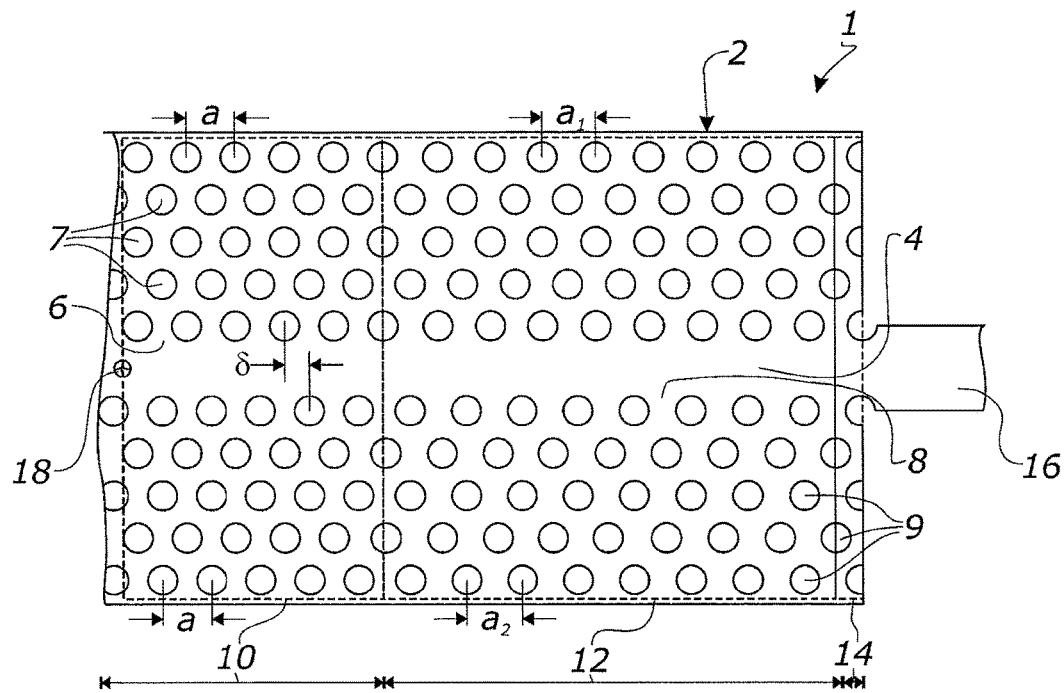
FIG. 2 shows a first view of a planar waveguide according to the invention.

This is according to the invention obtained by an optical device 1 as shown in FIG. 2. The optical device 1 comprises a planar waveguide 2, which comprises a longitudinal extending guiding region 4 with a first side 6 and a second side 8. A first nanostructure 7 comprising holes arranged in a triangular lattice structure with a lattice constant a is located on the first side 6 of the guiding region 4, and a second nanostructure 9 comprising holes arranged in a triangular lattice structure with a lattice constant a is located on the second side 8 of the guiding region 4.

The planar waveguide 2 includes a first longitudinal section 10, where the first nanostructure 7 and the second nanostructure 9 are arranged substantially glide-plane-symmetric about the guiding region 4 of the planar waveguide 2. A quantum emitter 18, e.g. in form of a quantum dot, is embedded in the guiding region 4 of the first longitudinal region 10. As defined in the present invention, the term "substantially glide-plane-symmetric" means that the first nanostructure 7 and the second nanostructure 9 are mutually shifted or translated in the longitudinal direction with a translation length δ, where the translation length is in the range 0.25a-0.75a, preferably δ approximately being 0.5a.

The planar waveguide 2 with glide-plane-symmetric nanostructures 7, 9 about a guiding region 4 provides a waveguide, whose modes have electric fields with a strong in-plane circular polarisation. The modes of the structure can couple to the different spin states of quantum dots or any integrated quantum emitter, whose transition dipole moment is circularly polarised. Accordingly, the invention provides a photonic nanostructure that enables photon qubits to interact very efficiently with spin qubits, and thereby a device where a quantum emitter 18 with a high efficiency can couple to the planar waveguide 2 and be read out.

This technical effect is illustrated in—FIGS. 3c and 3d, which show the magnitude of the electric fields of a mode of a glide-plane-symmetric waveguide having the same refractive index and lattice characteristics as the example shown in FIG. 1. Here the field is shown in terms of right and left hand circularly polarized field components. It can be seen that $E_R$ is maximum when $E_L$ is zero. Thus, the mode has a strong in-plane circular polarization. Positions with a strong right hand circular polarization for the right propagating mode have a strong left hand circular polarization for the left propagating mode. The example given here is based on a photonic-crystal waveguide, but this glide-plane symmetry can potentially be implemented in any nanostructured waveguide.

The planar waveguide is advantageously made from a dielectric material, such as a III-V semiconductor material. The material may for instance be made of Gallium Arsenide (GaAs), Indium Gallium Arsenide (InGaAs), or Aluminium Arsenide (AlAs). This provides a waveguide which is particular adapted to for instance quantum dots. The quantum dot is preferably also made of an III-V semiconductor material. The quantum dot advantageously has a height of 1-10 nm, and an in-plane size in the range of 10-70 nm and may consist of approximately 10∧5 of atoms. In one advantageous embodiment, the planar waveguide 2 is made from GaAs and the quantum dot from InGaAs. The quantum emitter may for instance be epitaxial grown, e.g. via molecular beam epitaxy or deposition.

In general, it is recognised that the first nanostructure 7 and the second nanostructure 9 need to be arranged with some sort of periodic structure or lattice structure and that the structures of first nanostructure 7 and the second nanostructure 9 are mutually shifted in the longitudinal direction of the planar waveguide 2 compared to a waveguide with mirror-symmetric nanostructure as shown in FIG. 1. It is noted that even a small shift of 25% of a lattice period (or equivalently a 75% shift) will provide a large improvement of the coupling efficiency of the spin coupling. However, in order to maximise the coupling efficiency, the shift should be approximately half a period.

As shown in FIG. 2, the first nanostructure 7 and the second nanostructure 9 may be arranged with a triangular lattice having a lattice constant a. The lattice constant a may advantageously lie in the interval 100-500 nm, e.g. around 250 nm. The nanostructures may be substantially circular shaped and have a diameter of between 0.2a and 0.4a, e.g. around 0.3a.

The guiding region may for instance be in the region 100-1000 nm. The guiding region is often formed by removing a line of holes. Accordingly, the transverse distance between centres of proximal nanostructures (e.g. holes) on the first side and the second side is approximately √3 times the lattice constant a.

The first nanostructure 7 and the second nanostructure 9 may comprise air holes. However, in principle the nanostructure 7, 9 may also be made of a different material than the remainder of the planar waveguide material and having a refractive index being different from that of the remainder. The planar waveguide 2 may be adapted to guide light within a wavelength interval in the region of 620-1200 nm, and correspondingly the quantum emitter emits photons having a wavelength within said interval.

The planar waveguide 2 may advantageously have a thickness of 0.5a-0.6a, or equivalently in the range from 125-150 nm. Accordingly, it is seen that the planar waveguide 2 is a slab waveguide or also what in the technical area is called a membrane. The planar waveguide 2 is advantageously designed as a floating structure along at least a substantial part of the planar waveguide 2. Such a design minimises the losses by minimising light being coupled out of the plane.

Overall, it is seen that arranging or embedding the quantum emitter 18 in the first longitudinal region 10 of the planar waveguide 2 provides a highly efficient spin-photon interface. However, the interface still needs to be combined with standard on-chip waveguide technology in order to be implemented in quantum information technology systems.

In order to combine the spin-photon interface with a read-out to standard waveguide technology, the planar waveguide 2 comprises a second longitudinal region 14, in which the first nanostructure 7 and second nanostructure 9 are arranged substantially mirror symmetric (or up-down symmetric) about the guiding region 4. A transition region 12 is arranged between the first longitudinal section 10 and the second longitudinal section 14, in which the geometry of the first nanostructure 7 and second nanostructure 9 gradually changes from glide-plane symmetry to mirror symmetry. Thereby, the guided mode is gradually changed from a circular polarisation to a linear polarisation with low or no loss. The light can thereby more efficiently be converted and coupled to conventional waveguide technology such as a ridge waveguide 16 as shown in FIG. 2.

The longitudinal extent of the first longitudinal region 10 may advantageously be in the range of 1-30 lattice constants a (or nanostructure periods), e.g. around 5-6 lattice constants a. The longitudinal extent of the transition region 12 may advantageously be in the range of 3-30 lattice constants a (or nanostructure periods), or in the range of 4-20 lattice constants a, or in the range of 5-15 lattice constants a, e.g. around 8 lattice constants a. There are as such no restrictions on the length of the second longitudinal region 14 as long a proper conversion has been obtained through the transition region 12. Accordingly, the second longitudinal region 14 may as such only constitute the end part of the transition region 12.

According to one embodiment, a lattice constant of the first nanostructure 7 and/or a lattice constant of the second nanostructure 9 of the intermediate transition region 12 are different from that of the first longitudinal region 10. In practice, the transition may be achieved in a number of ways. The nanostructures of the first region 10 and the second region 14 may for instance have the same lattice constant a. The first nanostructure 7 of the transition region 12 may have a lattice constant $a_1=a+\Delta a$ (or $a_1=a-\Delta a$), whereas the second nanostructure 9 of the transition region 12 may have the same lattice constant ($a_2=a$) as the first region 10 and the second region 14 (or vice versa). Alternatively, the first nanostructure 7 of the transition region 12 may have a lattice constant $a_1=a+0.5\Delta a$, whereas the second nanostructure 9 of the transition region 12 may have a lattice constant $a_2=a-0.5\Delta a$. In general, it is seen that the transition may be obtained over $a/2\Delta a$ periods.

Preferably, the lattice constant of the first longitudinal region 10 is identical to the lattice constant of the second longitudinal region 14. However, in principle, it is also possible that the lattice constants of the two regions are different, e.g. in order to accommodate for the different mode profiles.

If a quantum emitter with optical transitions that are circularly polarized is placed in a glide-plane-symmetry waveguide as shown for the first longitudinal region 10 of the planar waveguide 2, the emission direction of the emitted photon is determined by the handedness of the transition. The directional coupling probability, $\beta_{dir}$, of the emission reaches values in the suggested structures approaching unity. This directional coupling efficiency is the product of the probabilities that a photon couples to the waveguide, $\beta$, and the probability that it propagates in the correct direction, $F_{dir}$. This directly translates to the probability of successfully reading out the spin of an emitter, which is the key figure of merit for suggested applications in quantum information technology. In the shown embodiment, a quantum dot 18 is coupled to a glide-plane-symmetric waveguide, but this idea can be extended to any quantum emitter.

Figure 5:
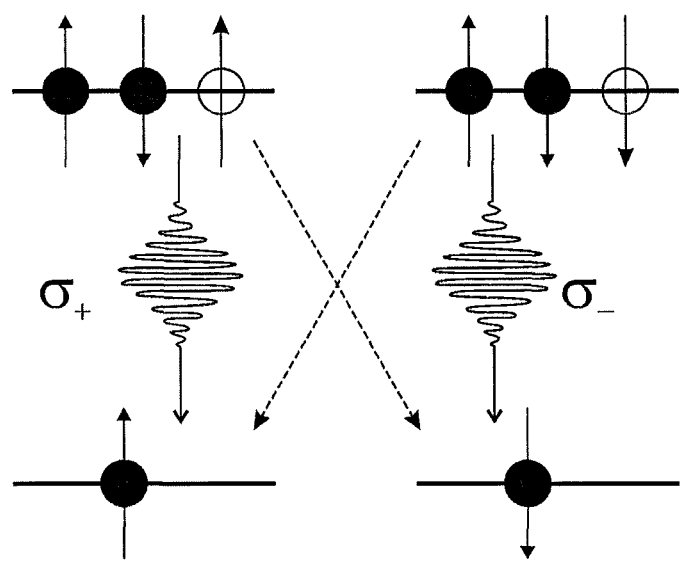
FIG. 5 shows a level scheme of a charged exciton in a quantum dot.

The highly directional emission in these structures can be used to read out the spin state of a single electron in a quantum dot. A linearly polarized pi-pulse on resonance with the degenerate trion transitions transfers the quantum dot population into one of the two excited states, depending on the initial spin orientation of the ground-state, as shown in FIG. 5. The propagation direction of the ensuing emission is strongly correlated with the polarization of the transition dipole of the decay channel. The success probability, defined as the probability that an emitted photon propagates in the correct direction, is given by $P_s=\beta_{dir}$, while the probability of the photon propagating in the wrong direction is given by, $P_{err}=\beta(1-F_{dir})$.

This can be exploited to create spin-path entanglement between single quantum dots and the photons they emit. Initialization of the spin qubit in either the spin-up, $|\uparrow\rangle$, or spin-down, $|\downarrow\rangle$, states can be done optically by driving one of the two transitions with an appropriate circularly polarized laser. This is followed by a pi/2-rotation of the spin to put it in a coherent superposition of the two ground-states. A pi-pulse excitation leads to the emission of a single photon, the propagation direction of which is entangled with the spin $$|\uparrow\rangle \xrightarrow{B_{xy,\pi/2}} \frac{1}{\sqrt{2}}(|\uparrow\rangle + |\downarrow\rangle) \xrightarrow{\pi} \frac{1}{\sqrt{2}}(|\uparrow, R\rangle + |\downarrow, L\rangle),$$

where $|L\rangle$ and $|R\rangle$ denote the left and the right propagating photon.

Figure 4:
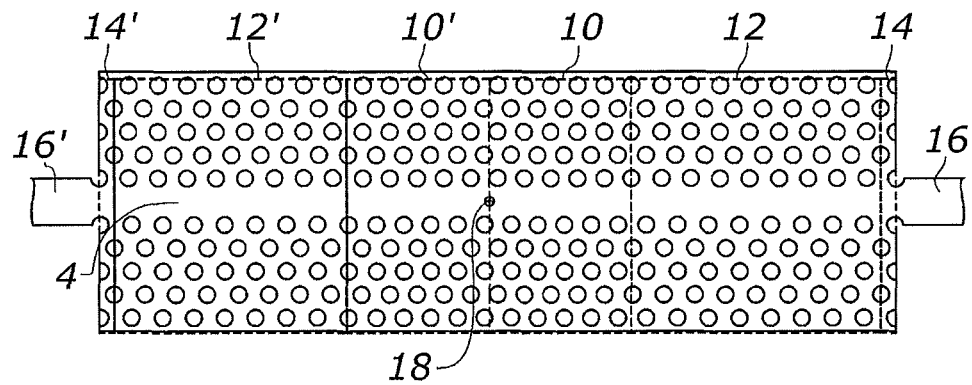
FIG. 4 shows a second view of the planar waveguide according to the invention.

Since the emitted photon may be emitted in two directions, the planar waveguide also comprises an additional first longitudinal region 10', an additional transition region 12' and an additional second longitudinal region 14', which are positioned on an opposite longitudinal side of the first longitudinal region 10 as shown in FIG. 4, and which have the same geometric properties as the first longitudinal region 10, the transition region 12, and the second longitudinal region 14, respectively. Likewise, the additional second longitudinal region 14' may be coupled to a ridge waveguide 16' or another conventional waveguide. Thus, it is seen that a planar waveguide 2 is provided where the quantum emitter 18 is coupled into the first longitudinal region 10, 10' and then propagates in the guiding region 4 towards either the second longitudinal region 14 or the additional second longitudinal region 14'. The emitted photon will with high probability couple to a specific propagation direction dependent on the spin state of the photon.

FIG. 5 shows the electronic levels of a negatively charged exciton in a quantum dot with spin up and spin down ground states. If either of these ground states is excited resonantly, they spontaneously emit a photon and return to the same ground state. The transition dipole moment of the emission process depends on the spin of the photon ground state. For a spin-up ground state the dipole moment $\sigma_+$ has a right-hand circularly polarized dipole moment, while a spin up ground state has a left-hand circularly polarized dipole moment $\sigma_-$. The dashed diagonal lines indicate the dipole-"forbidden" transitions.

Figures 6A, 6B:
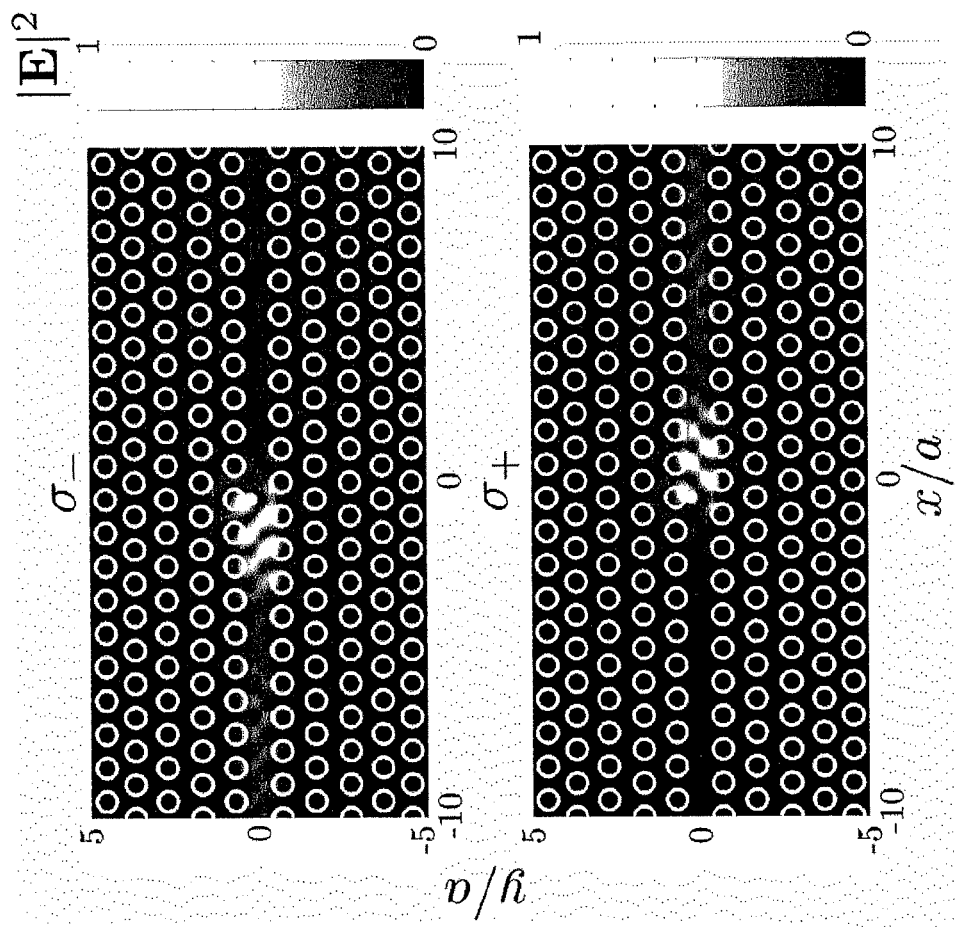
FIG. 6 shows a numerical modelling of the emission intensity of dipoles with opposite handed circular polarisation in the waveguide according to the invention.

Since the two dipole moments $\sigma_+$, $\sigma_-$ have opposite handed circular polarization, the emitted photon from the quantum emitter 18 will either be coupled to the right or the left in the planar waveguide shown in FIG. 4. The two transition dipole moments $\sigma_+$, $\sigma_-$ thus couple to modes propagating in different directions and the spin of the electron in the quantum dot determines the direction of the emitted photon. This is shown in FIG. 6, which illustrates a numerical modelling of the emission of dipoles with opposite handed circular polarization, where FIG. 6a shows that left hand circularly polarized dipoles $\sigma_-$ couple to the left propagating mode, while FIG. 6b shows that right hand circularly polarized dipoles $\sigma_+$ couple to the rightward propagating mode.

The interaction of a photon propagating in the glide-plane waveguide mode with the emitter is also strongly correlated with the electronic state of the emitter. By controlling the internal state of the quantum emitter, we can construct a single-photon transistor and a controlled NOT (cNOT) gate, both of which are fundamental building blocks of quantum information technology.

In the following various examples of optical devices implementing the planar waveguide 2 according to the invention is described.

Example 1: Spin Readout and Single-Photon Diode

Figure 7:
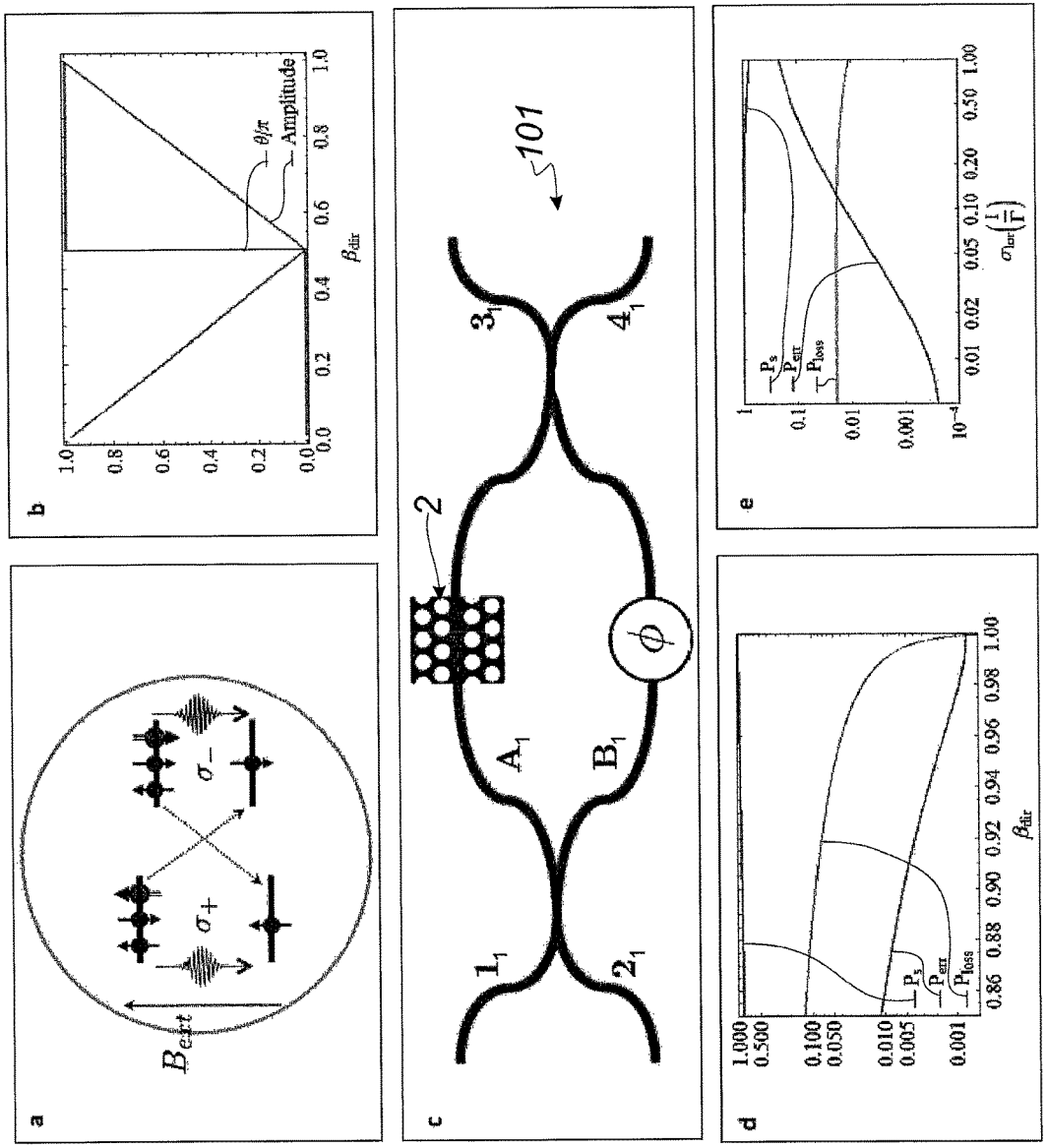
FIG. 7 shows a first embodiment of an optical device implementing a planar waveguide according to the invention.

FIG. 7 illustrates a first optical device 101 implementing a planar waveguide 2 according to the invention, where FIG. 7c shows a Mach-Zehnder interferometer suggested for on-chip spin readout in the Heitler regime. The interaction with the quantum dot takes place in a section of the glide-plane-symmetric waveguide (GPW) 2 placed in path A. Path B includes a phase control, which is necessary to ensure that the interferometer is correctly balanced. FIG. 7a shows an external magnetic field, $B_{ext}$, along the growth direction which splits the two circularly polarized transitions, denoted with dipoles $\sigma_+$ and $\sigma_-$. In addition to energetically splitting the two circular transitions, the external magnetic field suppresses the diagonal transitions denoted by the dashed arrows. FIG. 7b shows the phase and probability amplitude for a single photon forward-scattered in a GPW as a function of the directional $\beta$-factor. FIG. 7d shows the probabilities of a successful and of a false spin readout, which are plotted alongside the photon loss probability as a function of the directional $\beta$-factor. Here we assumed the incident single photon to have a Lorentzian spectral amplitude of width $\sigma_{lor}=0.02\Gamma$, where $\Gamma$ is the excited state decay rate. FIG. 7e shows the same three probabilities plotted as a function of the single-photon spectral width for $\beta_{dir}=0.98$. This clearly shows how sensitive operating in the Heitler regime is to the width of the incoming photon.

By integrating the planar waveguide 2 into an on-chip Mach-Zehnder Interferometer (MZI), as shown in FIG. 7c, it is possible to read out the spin ground state of a charged quantum dot (QD) and construct a single-photon diode. The MZI is balanced so that a single photon incident in arm 1₁ will exit through arm 4₁. A single photon propagating along path A₁ and on resonance with the $\sigma_+$ will acquire an additional pi phase shift relative to a photon propagating along path B₁, if the quantum dot is in the spin-up ($|\uparrow\rangle$) ground-state. This results in the single photon incident in arm 1₁ exiting through arm 3₁, while a single photon incident when the QD is in the state $|\downarrow\rangle$ will exit in arm 4₁. Thus, this constitutes an on-chip readout of the QD-spin state. Any reduction of the directional $\beta$-factor, $\beta_{dir}$, leads to a lower total transmission (photon-loss) and to a reduced MZI-visibility. A non-unity visibility causes errors in the spin readout, incorrectly channeling a fraction of photons into arm 4₁ even though the QD is in the state IT). On the other hand, the spin qubit in the state is always detected perfectly for a large splitting between the two transition energies by the external magnetic field, $B_{ext}$. In the limit of spectrally very narrow single photons compared to the scattering transition, the probabilities of successful spin readout, a false spin readout, and of photon-loss are given by $$P_s \simeq \frac{\beta_{dir}^2+1}{2}, P_{err} \simeq \frac{(1-\beta_{dir})^2}{2}, \text{ and } P_{loss} \simeq \beta_{dir} - \beta_{dir}^2.$$

The exact solutions to these probabilities for a single-photon pulse of narrow but finite spectral width are shown FIG. 7d. This is straightforward to calculate using a single-photon scattering formalism, and in FIG. 7e, the above-shown probabilities as a function of the spectral width of a single photon for $\beta_{dir}=0.98$ is shown.

The same device can also be used as a single-photon diode, isolating arm 1₁ from any unwanted back-reflection taking place in arm 3₁. For this, it is assumed that the spin is in the state $|\uparrow\rangle$ and single photons resonant with the $\sigma_+$ transition are entering through arm 1₁ and exit through arm 3₁, where they are partially reflected reentering the MZI in a backwards propagating direction. For sufficiently high $B_{ext}$ the $\sigma_+$ photons are completely detuned from the $\sigma_-$ transition and will pass the QD with ideally no interaction taking place, exiting the interferometer in arm 2₁. The transmission probability of this diode is given by $P_s$, while the probability that a back-reflected photon in arm 3₁ is routed back into arm 1₁ given by $P_{31}=((1-F_{dir})\beta)^2$.

Example 2: Quantum Non-Demolition Measurement

Adding coherent control of the single electron spin qubit, allows us to create arbitrary superpositions of the two single electron ground-states, making additional applications attainable. Such control can be achieved both by optical methods and through in-plane oscillating magnetic fields, $B_{\mu w}$, created by a microwave source, which is shown schematically in FIG. 8a. Using this control a single-photon quantum non-demolition (QND) detector can be built by following methods known per se. Initialization of the spin qubit in the state $|\uparrow\rangle$ can be done through optical spin pumping by driving the $\sigma_-$ transition. Next, a pi/2-rotation of the spin qubit is carried out, making the transformations:

$$|\uparrow\rangle \xrightarrow{\pi/2} \frac{1}{\sqrt{2}}(|\uparrow\rangle+|\downarrow\rangle), \text{ and } |\downarrow\rangle \xrightarrow{\pi/2} \frac{1}{\sqrt{2}}(-|\uparrow\rangle+|\downarrow\rangle).$$

which can be done by $B_{\mu w}$. A single photon on resonance with the $B_{\mu w}$ transition, $|k_b\rangle$, will only obtain a phase shift when the quantum dot is in the state $|\uparrow\rangle$. After the single photon has past the interaction region, another pi/2-rotation of the spin qubit is made. The total sequence looks as follows:

$$|\uparrow\rangle \xrightarrow{\pi/2} \frac{1}{\sqrt{2}}(|\uparrow\rangle+|\downarrow\rangle) \xrightarrow{k_b} \frac{1}{\sqrt{2}}(\bar{t}_k|\uparrow,k_b\rangle+|\downarrow,k_b\rangle)=$$

$$\frac{1}{\sqrt{2}}(\bar{t}_k|\uparrow\rangle+|\downarrow\rangle)|k_b\rangle \xrightarrow{\pi/2}$$

$$\frac{1}{2}((\bar{t}_k-1)|\uparrow\rangle+(\bar{t}_k+1)|\downarrow\rangle)|k_b\rangle$$

when a single photon passes the interaction region. In the second step of this sequence, it is essential that the photon-matter state is separable after the interaction, whereby it can be rewritten as a product of the unaltered photon state, $|k_b\rangle$, and a coherent superposition of the two spin ground states. In the ideal case one of the components of the spin-state will have acquired a pi phase shift due to the interaction with the emitter. The pi/2 rotation in the last step of the sequence maps the coherent superposition back to either the spin-up or the spin-down state. For the ideal scattering case ($t_k \rightarrow -1$) the original spin state is recovered when a photon passed the interaction region and the spin state is flipped when no photon passed the interaction region (as seen in the following equation):

$$|\uparrow\rangle \xrightarrow{\pi/2} \frac{1}{\sqrt{2}}(|\uparrow\rangle+|\downarrow\rangle) \xrightarrow{\pi/2} |\downarrow\rangle$$

From the previous equation, it is seen that—assuming perfect initialization, control, and readout of the spin state—the success probability of the QND measurement goes as $\beta_{dir}^2$. One of the methods proposed above can now be used to read out the state of the spin using a stream of single photons or a weak coherent field, thus completing the quantum non-demolition single-photon detection. The amplification of the non-demolition detector is limited by the non-zero branching ratio for the dipole-"forbidden" transition as discussed above.

Example 3: Single-Photon Transistor and cNot Gate

In Example 1 it was shown that using an MZI, the single-spin ground state of a trion can be efficiently read out, and in Example 2 it was illustrated how a single-photon can be used to control the internal state of the quantum dot.

In this Example, we combine these two ideas into a single-photon transistor/switch, where a single gate photon controls the flow of subsequent photons. Again, a trion is used in an external magnetic field pointing along the growth direction. This is shown in FIG. 8a, where an external magnetic field, $B_{ext}$, along the growth direction splits the two circularly polarized transitions, denoted with the dipoles moments $\sigma_+$ and $\sigma_-$. In addition to energetically splitting the two circular transitions the external magnetic field suppresses the diagonal transitions denoted by the dotted arrows. Coherent control of the spin qubit can be obtained through oscillating in-plane magnetic fields, generated by a microwave source on resonance with the electron spin transition, $B_{\mu w}$. FIG. 8b shows the QD placed at a position of high directional β-factor within the GPW. The arrows indicate what propagation direction in the waveguide the respective transitions interact with. FIG. 8c shows a schematic view of a sample design for the experimental realization of the single-photon transistor and deterministic cNOT-gate.

The GPW is in one of the arms of the ridge waveguide MZI and an adjustable phase control, ϕ, is in the other. An add/drop filter is not shown explicitly in the figure but can be realized either between the two ridge waveguides ($2_2'$ and $A_2$) or after coupling into the planar waveguide 2.

In addition to enabling the coherent control between the two single-electron ground states through microwave pulses, $B_{\mu w}$, the external magnetic field, $B_{ext}$, leads to Zeeman splitting between the two circular transitions on the order of tens of GHz. This splitting allows two distinct paths for the photons addressing the $\sigma_+$ and the $\sigma_-$ circular transitions, cf. FIG. 8a, and these paths are marked with $\sigma_+$ and $\sigma_-$ in FIGS. 8b and 8c. Narrow-bandwidth add/drop filters are required in order to be able to exploit the relatively small spectral differences and channel the two spectral modes into different paths of the optical circuit. Now a single gate-photon incident in arm $2_2'$, enables control of the internal state of the QD using a similar scheme as presented above for the QND measurement. However, the second pi/2-pulse in the sequence is replaced by a –pi/2-pulse, mapping the emitter back to its initial state, when it does not interact with a photon. The phase control, ϕ, of the MZI in FIG. 8c is set so that single photons incident in arm $1_2$ will exit in arm $4_2$ for the bare interferometer, i.e. no interaction with the $\sigma_+$ transition, while it will exit in arm $3_2$, when the emitter is initialized in the spin-up state. Now the following sequence can be used to implement the single-photon transistor.
1. The emitter is initialized in the spin-up state.
2. A pi/2-rotation of the spin leads to $1/\sqrt{2}$ ($|\uparrow\rangle+|\downarrow\rangle$)
3. If there is a single photon incident in arm $2_2'$, it scatters off the $\sigma_-$ transition and causes a pi phase shift between the two spin components, i.e. $1/\sqrt{2}$ ($|\uparrow\rangle-|\downarrow\rangle$). For no incident photon the state remains $1/\sqrt{2}$ ($|\uparrow\rangle-|\downarrow\rangle$). (It is assumed that we are on resonance with the transition, that the photon linewidth is narrow compared to the emitter and that $\beta_{dir}$ approaches 1).
4. The following –pi/2-rotation of the spin maps $1/\sqrt{2}$ ($|\uparrow\rangle-|\downarrow\rangle$)) to $|\downarrow\rangle$), while in the case of no photon incident in arm $2_2'$, the spin is rotated back into its initial state.
5. A train of single photon incident in arm $1_2$ will now exit in arm $4_2$, if there was a single gate-photon present and will exit in arm $3_2$, if no gate-photon interacted with the emitter.

To evaluate the performance of this single-photon transistor, it is spit up into two parts, viz. the switching of the emitter by the gate-photon and the routing of single photons in the MZI. First, the switching probability of the emitter, $P_{switch}$, which describes the total probability that a single photon incident in arm $2_2'$ switches the internal state of the emitter, is found. Here, a perfect control over the necessary microwave pulse sequence is assumed. In the limit of very narrow bandwidth gate-photons, this leads to $P_{switch} \approx \beta_{dir}$. This differs from the success probability of the QND-detection, since the outgoing state of the gate-photon is substantially irrelevant. In half of the cases, where the gate-photon is not scattered into the correct mode, due to non-unity directional β-factor, the correct spin state is still obtained in the end. This leads to an additional success probability of $\beta_{dir}-\beta_{dir}^2$ over that of the QND measurement. When the emitter is successfully switched, the flow of signal-photons coming out in arm $4_2$ is turned on. There are no additional errors for the signal-photons, since the MZI is assumed to work perfectly, when there is no interaction with the emitter. However, when there is no gate-photon and the emitter remains in the spin-up ground state, there will be some residual leakage into arm $4_2$, $P_{leak} \approx (1-\beta_{dir})^2$.

Figure 8:
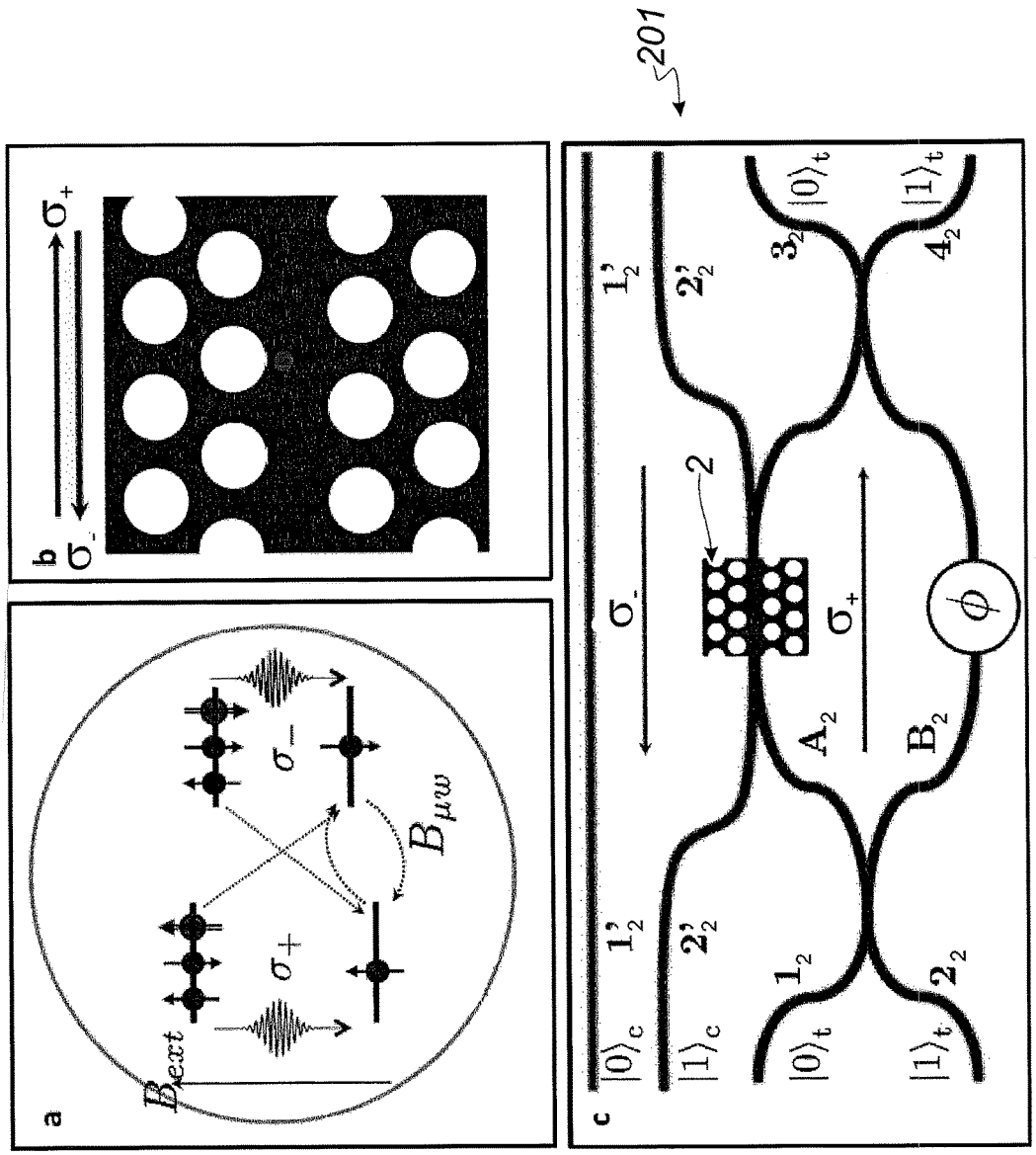
FIG. 8 shows a second embodiment of an optical device implementing a planar waveguide according to the invention.

This idea can be extended to operate as a deterministic cNOT-gate by simply adding an additional arm, which bypasses the other three, arm $1_2'$ in FIG. 8c. The computational basis of this cNOT-gate is given by the control qubit, $|0_c\rangle=1_2'$ and $|1_c\rangle=2_2'$, and the target qubit, $|0_t\rangle=(1_2, 3_2)$ and $|1_t\rangle=(2_2, 4_2)$. Using the same sequence of microwave pulses as for the transistor, it can be shown that the photonic circuit in FIG. 8 operates as a cNOT-gate with only one additional step needed. Another rotation of the spin state which is followed by a spin readout using for example a weak coherent field. This additional step is needed to disentangle the spin-state as has been demonstrated experimentally. No additional errors are added in this step. Depending on the result of the spin readout single qubit rotations on the output state will be necessary to obtain the correct state, and these rotations have already been included in the calculations below. A method of illustrating the functionality of the gate is by showing the truth table for the complete set of orthogonal two-photon basis states. The two tables below correspond to the expected truth tables of our gate when the final spin state has been measured in the state $|\uparrow\rangle$ or $|\downarrow\rangle$, respectively.

|  | $|1_c, 1_t\rangle_{out}$ | $|1_c, 0_t\rangle_{out}$ | $|0_c, 1_t\rangle_{out}$ | $|0_c, 0_t\rangle_{out}$ |
|---|---|---|---|---|
| $|\uparrow\rangle$ | | | | |
| $|1_c, 1_t\rangle_{in}$ | $(1-\beta_{dir})^2\beta_{dir}^2$ | $(1+\beta_{dir}^2-\beta_{dir})^2$ | 0 | 0 |
| $|1_c, 0_t\rangle_{in}$ | $(1+\beta_{dir}^2-\beta_{dir})^2$ | $(1-\beta_{dir})^2\beta_{dir}^2$ | 0 | 0 |
| $|0_c, 1_t\rangle_{in}$ | 0 | 0 | $\beta_{dir}^2$ | $(1-\beta_{dir})^2$ |
| $|0_c, 0_t\rangle_{in}$ | 0 | 0 | $(1-\beta_{dir})^2$ | $\beta_{dir}^2$ |
| $|\downarrow\rangle$ | | | | |
| $|1_c, 1_t\rangle_{in}$ | $(1-\beta_{dir})^2\beta_{dir}^2$ | $(1+\beta_{dir}^2-3\beta_{dir})^2$ | 0 | 0 |
| $|1_c, 0_t\rangle_{in}$ | $(1+\beta_{dir}^2-3\beta_{dir})^2$ | $(1-\beta_{dir})^2\beta_{dir}^2$ | 0 | 0 |

-continued

|  | $|1_c, 1_t\rangle_{out}$ | $|1_c, 0_t\rangle_{out}$ | $|0_c, 1_t\rangle_{out}$ | $|0_c, 0_t\rangle_{out}$ |
|---|---|---|---|---|
| $|0_c, 1_t\rangle_{in}$ | 0 | 0 | $\beta_{dir}^2$ | $(1-\beta_{dir})^2$ |
| $|0_c, 0_t\rangle_{in}$ | 0 | 0 | $(1-\beta_{dir})^2$ | $\beta_{dir}^2$ |

The scattering into the different loss modes is not explicitly shown in this table, which is the reason that the total probability in each of the rows does not add to one. The loss probability shows how often one of the two photons of the input state is lost, i.e. only events where both input photons make it through the circuit are included in the table. The errors in the top left quadrant of the table (diagonal elements) are given by the probability that a single photon is successfully transmitted through the circuit in arm $2_2'$, but does not flip the spin ground-state of the quantum dot, $(1-\beta_{dir})^2$, thus keeping the $\sigma_+$ transition active. This is multiplied with the probability that the subsequent target photon is transmitted through the MZI correctly after interacting with the $\sigma_+$ transition, $\beta_{dir}^2$. In the bottom right quadrant the probabilities are given by the transmission probabilities through an MZI containing an active transition. The bottom left and top right quadrants are all zeros, since there is no cross talk between arms $1_2'$ and $2_2'$. Here we have assumed that all detector clicks are caused by photons in our circuit and additional errors will be produced in experimental realizations due to non-zero background and dark counts.

The invention has been described with reference to advantageous embodiments. However, the scope of the invention is not limited to the illustrated embodiments, and alterations and modifications can be carried out without deviating from the scope of the invention, which is defined by the following claims.

List of Reference Numerals

| | |
|---|---|
| 1, 101, 201 | Optical device |
| 2 | Planar waveguide |
| 4 | Guiding region |
| 6 | First side |
| 7 | First nanostructure |
| 8 | Second side |
| 9 | Second nanostructure |
| 10, 10' | First longitudinal region |
| 12, 12' | Transition region |
| 14, 14 | Second longitudinal region |
| 16, 16' | Ridge waveguide |
| 18 | Quantum emitter/quantum dot |
| a | Lattice constant |
| $a_1$ | Lattice constant of first nanostructure in transition region |
| $a_2$ | Lattice constant of second nanostructure in transition region |
| $\delta$ | Mutual shift/translation between first nanostructure and second nanostructure |
| $\sigma_+$ | Right hand circularly polarized dipole |
| $\sigma_-$ | Left hand circularly polarized dipole |

The invention claimed is:

1. An optical device comprising a planar waveguide and a quantum emitter, wherein
the planar waveguide comprises:
a longitudinal extending guiding region with a first side and a second side,
a first nanostructure arranged on the first side of the guiding region, and
a second nanostructure arranged on the second side of the guiding region, wherein
the planar waveguide includes a first longitudinal region where the first nanostructure and the second nanostructure are arranged substantially glide-plane symmetric about the guiding region of the planar waveguide,
and wherein the quantum emitter is coupled to the first longitudinal region of the planar waveguide, wherein
the quantum emitter includes optical transitions that are circularly polarised and is embedded in the guiding region of the planar waveguide such that the quantum emitter is a single-photon emitter, which emits photons in a circular polarised mode, and wherein
the first longitudinal region of the planar waveguide is configured to support modes, where electric fields have a circular polarisation within the plane of the planar waveguide at the position of the quantum emitter, such that the photons from the single photon emitter is effectively coupled to the planar waveguide.

2. The optical device according to claim 1, wherein the single-photon emitter is a quantum dot.

3. The optical device according to claim 1, wherein the planar waveguide is a photonic-crystal waveguide.

4. The optical device according to claim 1, wherein the planar waveguide comprises a second longitudinal region, where the first nanostructure and the second nanostructure are arranged substantially mirror symmetric about the guiding region of the planar waveguide.

5. The optical device according to claim 4, wherein the planar waveguide comprises a transition region, arranged between the first longitudinal region and the second longitudinal region, and wherein the geometry of the first and the second nanostructure gradually changes from glide-plane symmetry to mirror symmetry.

6. The optical device according to claim 4, wherein a waveguide selected from the group consisting of ridge waveguide and strip waveguide is coupled to the second longitudinal region or the transition region.

7. The optical device according to claim 4, wherein the planar waveguide comprises a third longitudinal region on an opposite longitudinal side of the first longitudinal region, where the first nanostructure and the second nanostructure are arranged mirror symmetric about the guiding region of the planar waveguide.

8. The optical device according to claim 7, wherein the planar waveguide further comprises a second transition region arranged between the first longitudinal region and the third longitudinal region, wherein the geometry of the first and the second nanostructure gradually changes from a glide-plane symmetry to a mirror symmetry.

9. The optical device according to claim 1, wherein the planar waveguide is made from a dielectric material.

10. The optical device according to claim 1, wherein the first nanostructure and the second nanostructure are arranged in a first lattice structure and a second lattice structure, respectively, arranged in a triangular lattice and having a lattice constant a.

11. The optical device according to claim 10, wherein the lattice constant a lies in the interval 100-500 nm.

12. The optical device according to claim 11, wherein the wherein the lattice constant a lies in the interval 150-400 nm.

13. The optical device according to claim 11, wherein the wherein the lattice constant a lies in the interval 200-300 nm.

14. The optical device according to claim 10, wherein the planar waveguide has a thickness of between 0.2a and 1a.

15. The optical device according to claim 10, wherein the planar waveguide has a thickness of between 0.4a and 0.8a.

16. A single-photon transistor comprising the optical device according to claim 1.

17. A controlled NOT gate comprising the optical device according to claim 1.

18. The optical device according to claim 1, wherein the first nanostructure and the second nanostructure are mutually shifted in a longitudinal direction by 25%-75% of the period in the first longitudinal region of the planar waveguide.

19. An optical device comprising a planar waveguide and a quantum emitter, wherein
the planar waveguide comprises:
a longitudinal extending guiding region with a first side and a second side,
a first nanostructure arranged on the first side of the guiding region, and
a second nanostructure arranged on the second side of the guiding region, wherein
the planar waveguide includes a first longitudinal region where the first nanostructure and the second nanostructure are arranged glide-plane symmetric about the guiding region of the planar waveguide, and wherein the quantum emitter is coupled to the first longitudinal region of the planar waveguide, wherein
the quantum emitter includes optical transitions that are circularly polarised and is embedded in the guiding region of the planar waveguide such that the quantum emitter is a single-photon emitter, which emits photons in a circular polarised mode, and wherein
the first longitudinal region of the planar waveguide is configured to support modes, where electric fields have a circular polarisation within the plane of the planar waveguide at the position of the quantum emitter, such that the photons from the single photon emitter are effectively coupled to the planar waveguide.

20. The optical device according to claim 19, wherein the planar waveguide comprises a second longitudinal region, where the first nanostructure and the second nanostructure are arranged mirror symmetric about the guiding region of the planar waveguide.

* * * * *